United States Patent
Baek et al.

(10) Patent No.: US 8,804,098 B2
(45) Date of Patent: Aug. 12, 2014

(54) MASKLESS EXPOSURE APPARATUS HAVING MEASUREMENT OPTICAL UNIT TO MEASURE DEPTHS OF FOCUS OF A PLURALITY OF BEAMS AND CONTROL METHOD THEREOF

(75) Inventors: Dong Seok Baek, Suwon-si (KR); Sang Don Jang, Suwon-si (KR); Ho Seok Choi, Suwon-si (KR); Hi Kuk Lee, Yongin-si (KR); Oui Serg Kim, Seongnam-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 426 days.

(21) Appl. No.: 12/926,920

(22) Filed: Dec. 17, 2010

(65) Prior Publication Data
US 2011/0157569 A1    Jun. 30, 2011

(30) Foreign Application Priority Data
Dec. 24, 2009    (KR) .................. 10-2009-0130749

(51) Int. Cl.
*G03B 27/52* (2006.01)
(52) U.S. Cl.
USPC .......................................................... 355/55

(58) Field of Classification Search
CPC ....... G03F 7/2051; G03F 7/70; G03F 7/7005; G03F 7/70391
See application file for complete search history.

(56) References Cited

U.S. PATENT DOCUMENTS

| | | | |
|---|---|---|---|
| 2005/0213068 A1* | 9/2005 | Ishii et al. | 355/67 |
| 2010/0133651 A1* | 6/2010 | Bruland | 257/529 |
| 2010/0208229 A1* | 8/2010 | Shin et al. | 355/77 |

FOREIGN PATENT DOCUMENTS

WO    WO 2009008605 A2 * 1/2009

* cited by examiner

*Primary Examiner* — Peter B Kim
*Assistant Examiner* — Michelle Iacoletti
(74) *Attorney, Agent, or Firm* — Harness, Dickey & Pierce, P.L.C.

(57) ABSTRACT

Example embodiments are directed to a maskless exposure apparatus that generates and/or corrects exposure data using at least one information of intensity information, central position information, focus information, and/or shape information of a plurality of beams acquired using a measurement optical unit, and a control method thereof. The maskless exposure apparatus includes the measurement optical unit including a photo sensor and an image sensor, and a control unit configured to generate and/or correct the exposure data using the information acquired by the measurement optical unit.

17 Claims, 20 Drawing Sheets

MASKLESS EXPOSURE APPARATUS HAVING MEASUREMENT OPTICAL UNIT TO MEASURE DEPTHS OF FOCUS OF A PLURALITY OF BEAMS AND CONTROL METHOD THEREOF

CROSS-REFERENCE TO RELATED APPLICATION

This application claims priority under 35 U.S.C. §119 to Korean Patent Application No. 2009-0130749, filed on Dec. 24, 2009 in the Korean Intellectual Property Office, the entire disclosure of which is incorporated herein by reference.

BACKGROUND

1. Field

Example embodiments relate to a maskless exposure apparatus that measures multiple beams using a measurement optical unit and generates and/or corrects exposure data using measured data, and a control method thereof.

2. Description of the Related Art

Recently, exposure apparatuses performing image exposure on a member to be exposed by modulated beams according to image data using a spatial light modulator, such as a digital micro mirror device (hereinafter, referred to as a 'DMD'), have been developed. The DMD is configured such that micro mirrors are arranged on multiple memory cells formed on a semiconductor substrate made of silicon. Angles of reflection surfaces of the micro mirrors are changed by electrostatic force of charges accumulated on the respective memory cells according to exposure data, and exposure points are formed at desired positions of exposure surfaces by the change of the angles of the reflection surfaces, thereby forming an image.

When exposure is performed using the above exposure apparatus, it is necessary to monitor whether or not ON/OFF operations of the respective micro mirrors are normally performed and whether or not a beam focus is normal, and to generate and correct exposure data according to monitored data.

SUMMARY

According to example embodiments, a control method of a maskless exposure apparatus includes acquiring, using a measurement optical unit, intensity information, central position information, focus information, and shape information of a plurality of beams, generated from a projection optical unit; and generating or correcting exposure data using at least one of the intensity information, the central position information, and focus information, and the shape information acquired by the measurement optical unit.

According to example embodiments, the generation or correction of the exposure data includes adjusting intensities of the beams irradiated from the projection optical unit using the intensity information of the plurality of beams acquired by the measurement optical unit.

According to example embodiments, the generation or correction of the exposure data includes calculating central positions of the plurality of beams using the intensity information of the plurality of beams acquired by the measurement optical unit; and correcting the exposure data by comparing the calculated central positions of the plurality of beams with an ideal central position of a beam.

According to example embodiments, the generation or correction of the exposure data includes: switching off at least one beam of the plurality of beams, the at least one beam having an intensity less than a reference lower limit or greater than a reference upper limit, the intensity information being acquired by the measurement optical unit.

According to example embodiments, the generation or correction of the exposure data includes switching ON beams being included within a field of view (FOV) and switching OFF the remaining beams.

According to example embodiments, the generation or correction of the exposure data includes: judging corresponding pixels as dead pixels when an amount of the plurality of beams acquired by the measurement optical unit is less than a reference amount or a shape of the beams is deviated from an ideal shape by a reference error; and switching off beams corresponding to the dead pixels, or switching off beams corresponding to pixels of a line including the dead pixels not affecting exposure results.

According to example embodiments, the generation or correction of the exposure data includes: acquiring depths of focus of the multiple beams acquired by the measurement optical unit; calculating a reference depth of focus from the depths of focus of the multiple beams; and adjusting focus ranges of respective beam spots using the reference depth of focus.

According to example embodiments, the generation or correction of the exposure data includes: acquiring depths of focus of the multiple beams acquired by the measurement optical unit; calculating a reference depth of focus from the depths of focus of the multiple beams; and switching ON beams corresponding to pixels being present within an effective focus region and switching OFF beams corresponding to the remaining pixels.

According to example embodiments, a maskless exposure apparatus includes a projection optical unit configured to generate a plurality of beams; and a measurement optical unit configured to acquire intensity information, central position information, focus information, and shape information of the plurality of beams by measuring the plurality of beams generated from the projection optical unit.

According to example embodiments, the maskless exposure apparatus, further includes a movable stage and guide on a table; a frame connected to a central portion of the stage; and at least two sensors on a side of the frame, wherein the projection optical unit is on a side of the frame opposite to the at least two sensors.

According to example embodiments, the projection optical unit includes an exposure head unit including a light source and a multi-exposure head unit, the multi-exposure head unit configured to generate the plurality of beams.

According to example embodiments, the measurement optical unit includes a photo sensor.

According to example embodiments, the measurement optical unit includes an image sensor.

According to example embodiments, the image sensor is a CMOS sensor or a CCD sensor.

According to example embodiments, the maskless exposure apparatus, further includes position adjusting stages that is configured to move the measurement optical unit in at least three dimensions.

According to example embodiments, the maskless exposure apparatus, further includes: a control unit to generate or correct exposure data using at least one information of the intensity information, the central position information, and focus information, and the shape information, acquired by the measurement optical unit.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
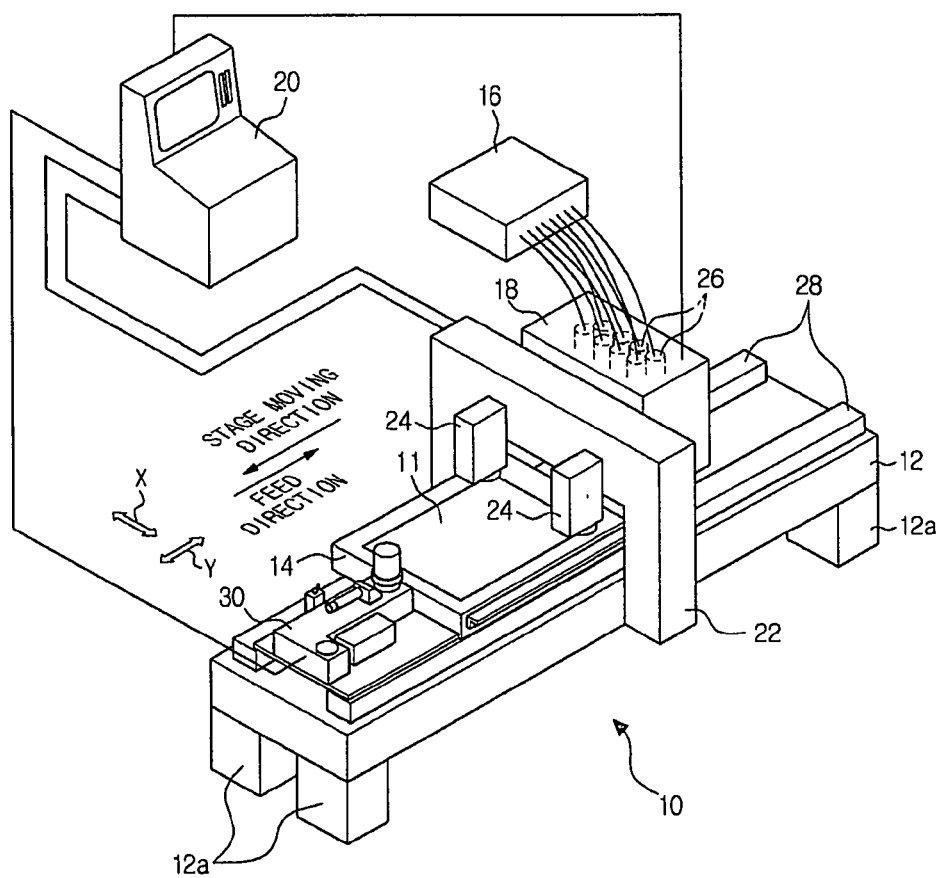
FIG. 1 is a perspective view of a maskless exposure apparatus according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a perspective view of a maskless exposure apparatus according to example embodiments.

A maskless exposure apparatus 10 is configured in a flat bed type, and includes a table 12 supported by four leg members 12a, and a stage 14 movable on a guide 30 located on the table 12 in a direction of Y-axis. A photosensitive material 11, such as a photoresist (PR), is applied to the upper surface of the stage 14. A gate-shaped frame 22 is connected to a central portion of the stage 14, and two position sensors 24 are installed on a side of the gate-shaped frame 22. The position sensors 24 sense movement of the stage 14 when the stage 14 moves, and then transmit the sensed signal to a control unit 20, which will be described later.

An exposure head unit 18 including a light source 16, to generate a light beam, such as a laser beam, and multi-exposure head unit 26 is installed on the side of the gate-shaped frame 22 opposite to the two position sensors 24. The exposure head unit 18 receives the beam generated from the light source 16, and irradiates multiple beams on the photosensitive material 11 through the multi-exposure head unit 26 when the stage 14 moves, thereby forming an image in a desired pattern.

A measurement optical unit 30 is connected to a side of the stage 14. The measurement optical unit 30 measures the multiple beams to acquire intensity information, central position information, shape information, and/or focus information of the multiple beams, and a detailed configuration thereof will be described later.

The control unit 20 controls a spatial light modulator (not shown) based on exposure data in a desired pattern so as to irradiate multiple beams, and generates and/or corrects exposure data based on information measured by the measurement optical unit 30 so as to irradiate multiple beams.

Figure 2:
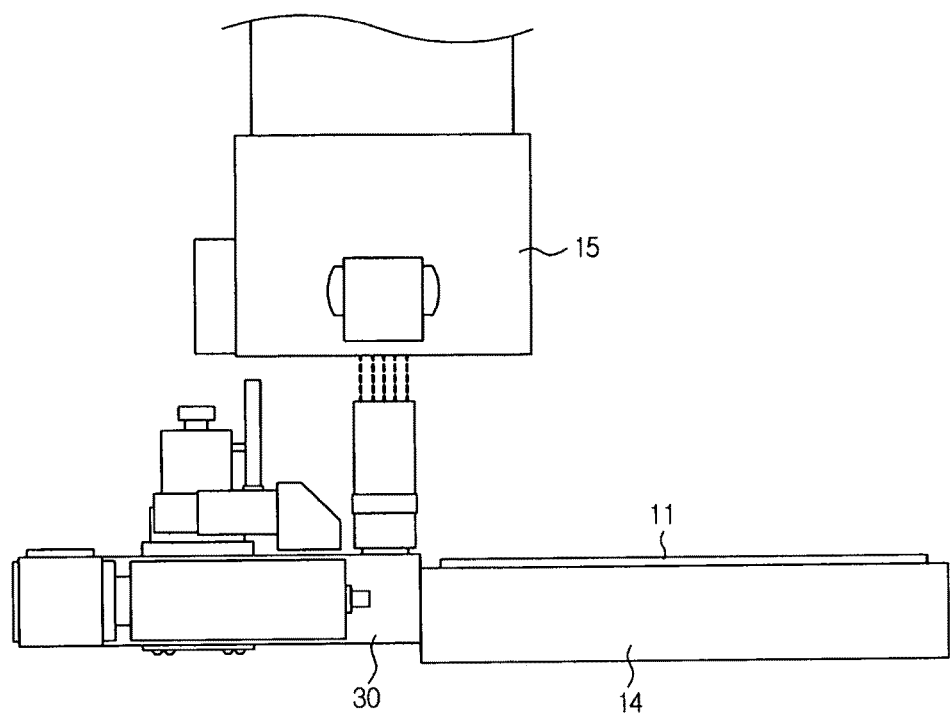
FIG. 2 is a schematic view illustrating the maskless exposure apparatus according to example embodiments in a multiple beam measurement state.

FIG. 2 is a schematic view illustrating the maskless exposure apparatus according to example embodiments in a multiple beam measurement state.

A projection optical unit 15 refers to the above-described exposure head unit 18 including the light source 16 and the multi-exposure head unit 26, and generates multiple beams. As shown in FIG. 2, the measurement optical unit 30 is connected to the stage 14, to which the photosensitive material 11 is applied, and measures the multiple beams irradiated from the projection optical unit 15. Hereinafter, a detailed configuration of the measurement optical unit 30 will be described with reference to FIGS. 3 to 4.

Figure 3:
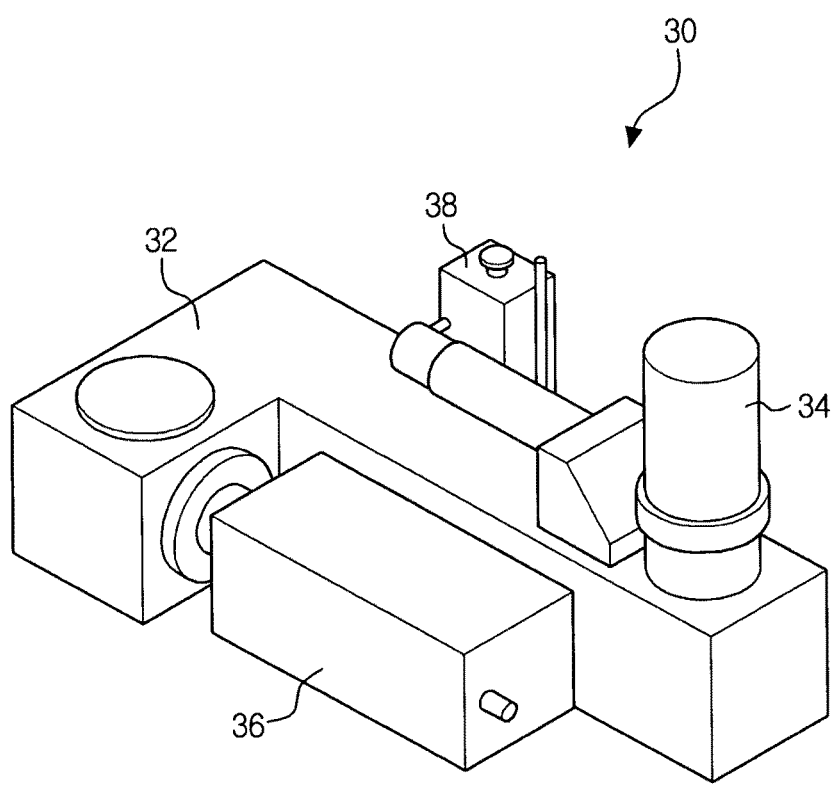
FIG. 3 is a perspective view of a measurement optical unit of the maskless exposure apparatus according to example embodiments.

FIG. 3 is a perspective view of the measurement optical unit of the maskless exposure apparatus according to example embodiments.

The measurement optical unit 30 includes a body 32, and an objective lens 34, an image sensor 36, and a Z-axis stage 38 which are connected to the body 32. The objective lens 34 receives and measures the multiple beams irradiated from the projection optical unit 15, and the image sensor 36 acquires image information of the multiple beams having passed through the objective lens 34. A CCD sensor or a CMOS sensor may be used as the image sensor 36. The measurement optical unit 30 may acquire respective shape and central position information of the respective multiple beams through the image sensor 36. Particularly, if the CCD sensor is used as the image sensor 36, intensity profile information of the multiple beams is acquired using energy value information of a gray scale level detected from the surface of the CCD sensor.

The measurement optical unit 30 further includes a photo sensor 54 (not shown in FIG. 3) which will be described later. The photo sensor 54 acquires central position information of the multiple beams, and acquires focus information of the multiple beams by comparing a measured beam profile with a reference beam profile using energy level detection of voltage output characteristics.

The Z-axis stage 38 allows the measurement optical unit 30 to move in a direction of a Z-axis. Although not shown in drawings, an X-axis stage and a Y-axis stage to allow the measurement optical unit 30 to move in directions of an X-axis and a Y-axis are also installed under the measurement optical unit 30. Through such a configuration, the measurement optical unit 30 measures the irradiated multiple beams while moving in a desired direction. Hereinafter, a detailed configuration of the measurement optical unit 30 will be described with reference to FIG. 4.

Figure 4:
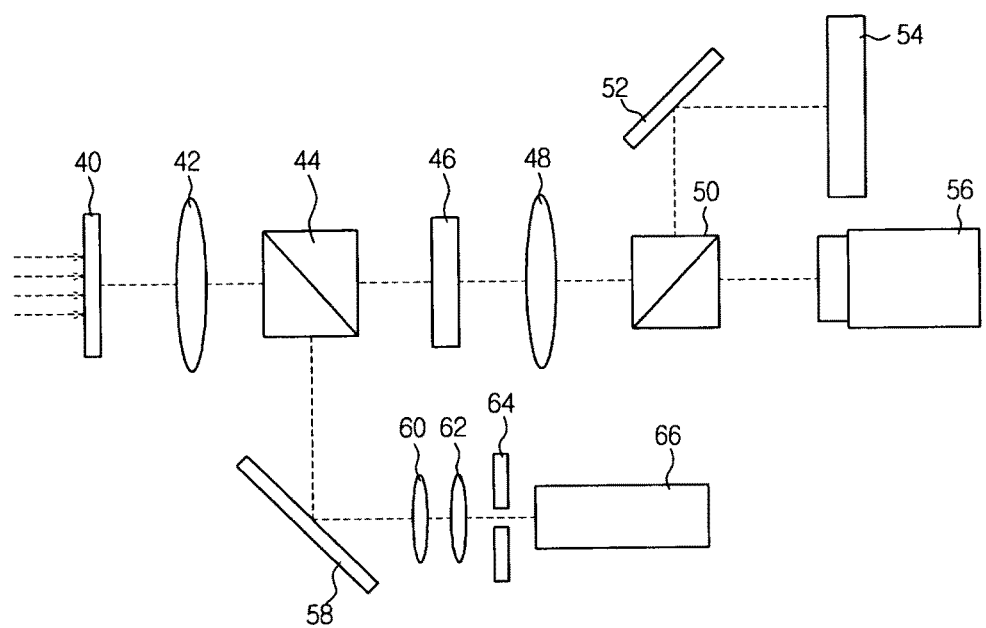
FIG. 4 is a view illustrating a detailed configuration of the measurement optical unit of the maskless exposure apparatus according to example embodiments.

FIG. 4 is a view illustrating a detailed configuration of the measurement optical unit of the maskless exposure apparatus according to example embodiments.

The measurement optical unit 30 includes a photo sensor 54, an image sensor 56, and an illumination unit 66. Functions of the photo sensor 54 and the image sensor 56 are described above, and the illumination unit 66 generates and supplies a light source so as to allow the measurement optical unit 30 to acquire image information. Further, the measurement optical unit 30 further includes lenses 42, 48, 60, and 62, an optical filter 46, beam splitters 44 and 50, reflecting mirrors 52 and 58, an opening 64, and/or a glass 40.

Now, an operation of the measurement optical unit 30 will be described with reference to FIG. 4. When multiple beams are irradiated on the glass 40, light generated from the illumination unit 66 passes through the opening 64 and lenses 60 and 62, is reflected by the reflecting mirror 58, passes through the beam splitter 44, and then reaches the glass 40 via the lens 42. Then, the reached light is reflected by the glass 40, passes the lens 42, the beam splitter 44, the optical filter 46, and the lens 48, and is split into two light parts by the beam splitter 50, and the two light parts reach the image sensor 56 and the photo sensor 54 via the reflecting mirror 52, respectively. The photo sensor 54 and the image sensor 56 acquire information of the multiple beams using the reached light. The measurement optical unit 30 acquires intensity information, central position information, shape information, and/or focus information of the multiple beams using the photo sensor 54 and the image sensor 56, as described above, and a method of generating or correcting exposure data using the acquired informations will be described hereinafter.

Figure 5:
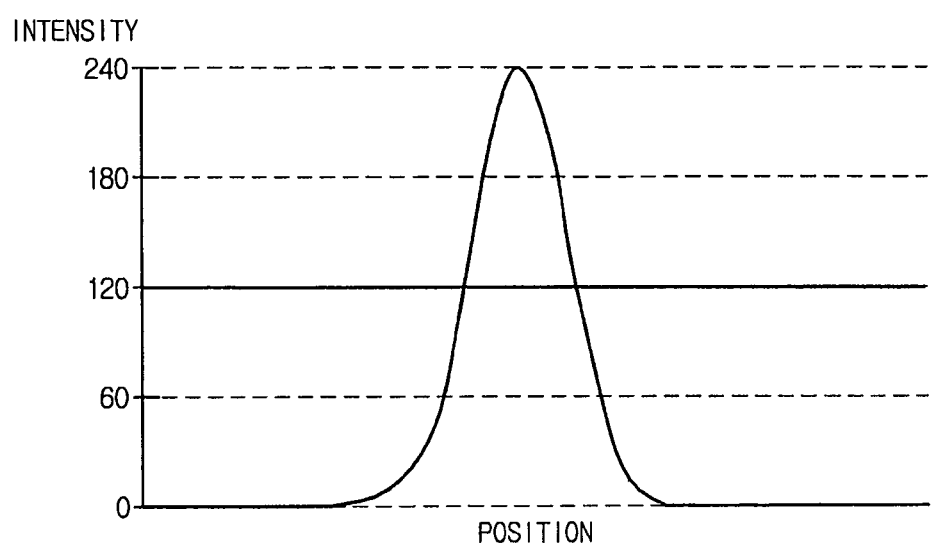
FIG. 5 is a graph illustrating an intensity of a beam acquired with the measurement optical unit of the maskless exposure apparatus according to example embodiments.

FIG. 5 is a graph illustrating an intensity of a beam acquired with the measurement optical unit of the maskless exposure apparatus according to example embodiments.

As shown in FIG. 5, an intensity of a beam has a Gaussian distribution, and in this case, a size of the beam is generally set based on a full width at half maximum (FWHM). That is, as shown in FIG. 5, the maximum intensity of the beam is 240, and thus the size of the beam is set up to a point corresponding to half of the maximum intensity, i.e., 120. A central position of the beam is acquired by calculating the mean of the beam per pixel based on the FWHM. The acquired central position of the measured beam may be used to generate and/or correct exposure data, and a detailed description thereof will be given later.

Figure 6:
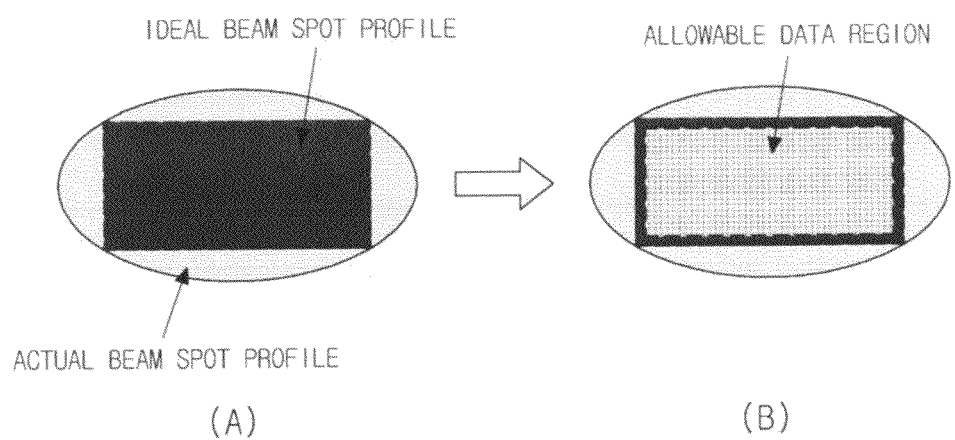
FIGS. 6(a) and 6(b) are views illustrating shape information of multiple beams acquired with a measurement optical unit of a maskless exposure apparatus according to example embodiments and correction or generation of exposure data using the shape information.

FIGS. 6(a) and 6(b) are views illustrating shape information of multiple beams acquired with a measurement optical unit of a maskless exposure apparatus according to example embodiments and correction or generation of exposure data using the shape information.

It is seen from FIG. 6(a) that an ideal beam spot profile is formed in a rectangular shape but an actual beam spot profile is formed in an oval shape. By selectively using only multiple beams present within an allowable field of view (FOV), which form the ideal beam spot profile and thus are actually usable, through comparison of the two shapes with each other, it may be possible to prevent lowering of exposure quality. That is, only pixels of the spatial light modulator within the allowable FOV are switched on, and other pixels of the spatial light modulator within remaining error regions are switched off. FIG. 6(b) displays an allowable data region calculated above.

Figure 7:
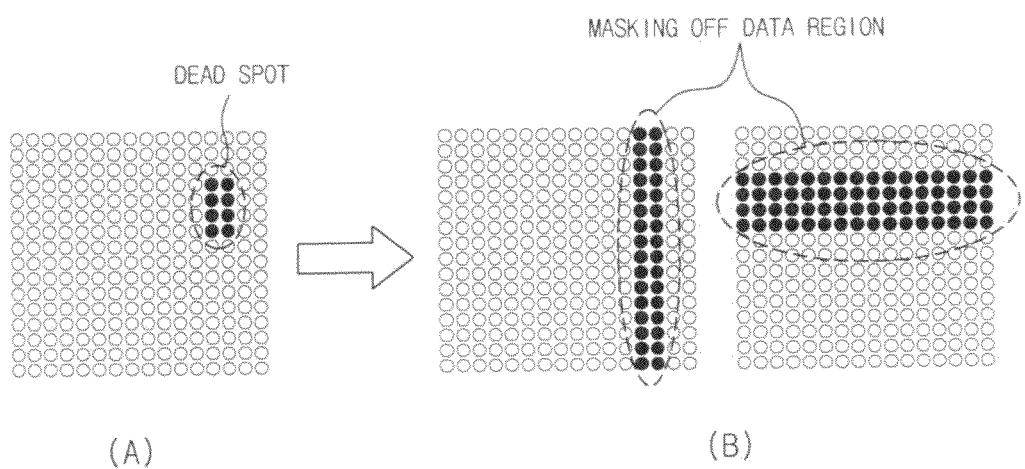
FIGS. 7(a) and 7(b) are views illustrating judgment of dead pixels using information acquired with a measurement optical unit of a maskless exposure apparatus according to example embodiments and correction or generation of exposure data using the dead pixel information.

FIGS. 7(a) and 7(b) are views illustrating judgment of dead pixels using information acquired with a measurement optical unit of a maskless exposure apparatus according to example embodiments and correction or generation of exposure data using the dead pixel information.

In general, in order to expose one line or plane in maskless exposure, multiple beams are overlapped with each other at narrow intervals and are continuously used. When dead pixels among bundles of pixels of the spatial light modulator are generated, a non-continuous part occurs among beam spots continuously used in the same manner as pixel or dot omission of a LCD panel, and then a line etch ratio (LER) which is one of criteria for judgment of exposure quality is deteriorated.

Here, judgment of a dead spot is carried out when the intensity of the beam is lower than a designated lower limit or the shape of the beam is deviated from a reference shape by a reference error. An actual driving state of the spatial light modulator is detected by detecting information of pixels, switching-on/off of which is not controlled, among pixels of the spatial light modulator in the above manner. When the dead pixels are detected, the beams corresponding to the dead pixels are switched off or the beams corresponding to a line including the dead pixel not affecting exposure results are switched off, thereby being capable of correcting exposure data.

Figure 8:
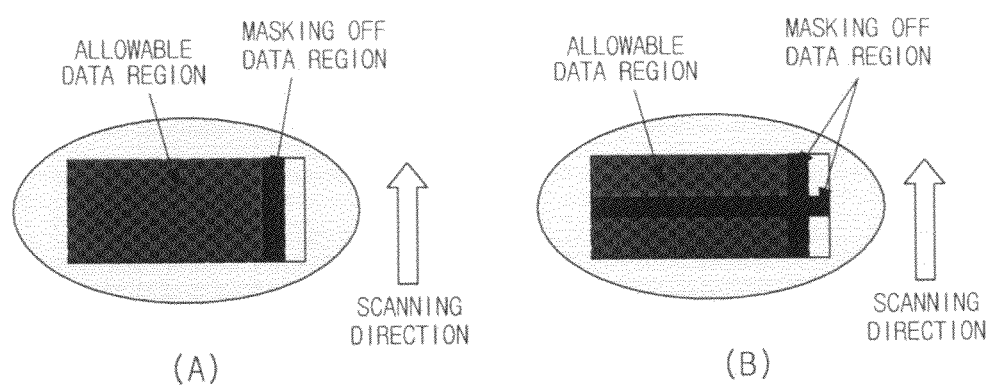
FIGS. 8(a) and 8(b) are views illustrating correction or generation of exposure data using dead pixel information and shape information of beams acquired with a measurement optical unit of a maskless exposure apparatus according to example embodiments.

FIGS. 8(a) and 8(b) are views illustrating correction or generation of exposure data using dead pixel information and shape information of beams acquired with a measurement optical unit of a maskless exposure apparatus according to example embodiments.

FIGS. 8(a) and 8(b) illustrate correction of exposure data using the example embodiments, described in FIGS. 6(a) and 6(b) and FIGS. 7(a) and 7(b), in combination. That is, beams corresponding to pixels within an allowable data region are switched on, and beams corresponding to pixels of a line including dead pixels not affecting an exposure indirection are switched off. FIG. 8(a) illustrates a case in which exposure data is switched off only in the same direction as a scanning direction, and FIG. 8(b) illustrates a case in which exposure data is switched off both in the same direction as the scanning direction and in a perpendicular direction to the scanning direction.

Figure 9:
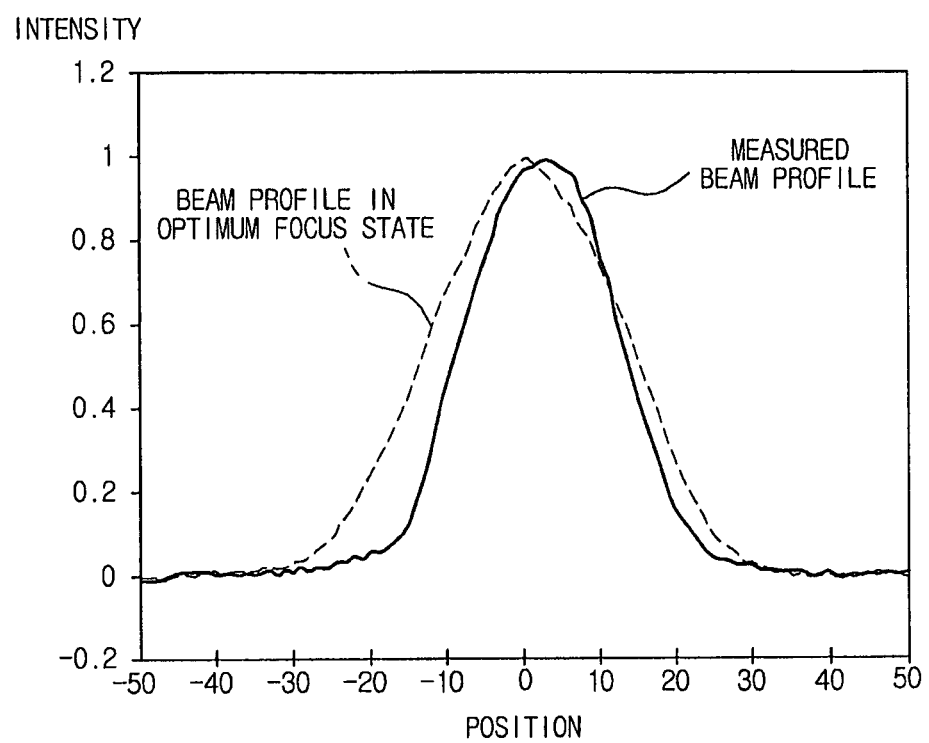
FIG. 9 is a graph illustrating profile information of beams acquired with a measurement optical unit of a maskless exposure apparatus according to example embodiments according to depths of focus of the beams.

FIG. 9 is a graph illustrating profile information of beams acquired with a measurement optical unit of a maskless exposure apparatus according to example embodiments according to depths of focus of the beams.

When multiple beams are measured, a measured beam profile is varied according to depths of focus. By comparing the measured beam profile with a beam profile in the optimum focus state, it may be possible to judge a degree of the multiple beams deviated from the optimum focus state. The measured focus information is used to generate or correct exposure data, and a detailed description thereof will be given later.

Figure 10:
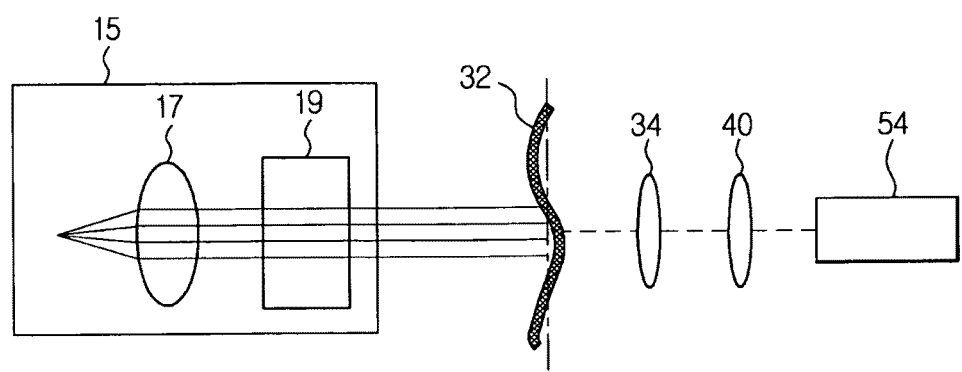
FIG. 10 is a view illustrating acquisition of a reference depth of focus (DOF) using focus information of the beams acquired with the measurement optical unit of the maskless exposure apparatus according to example embodiments.

FIG. 10 is a view illustrating acquisition of a reference depth of focus (DOF) using focus information of the beams acquired with the measurement optical unit of the maskless exposure apparatus according to example embodiments.

The projection optical unit 15 includes a projection lens 17 and an image forming position adjustment device 19. When the projection optical unit 15 irradiates multiple beams, the surface of the glass 32 is exposed to the multiple beams. Here, focus information passes through the lenses 34 and 40, and is measured by the photo sensor 54. In FIG. 10, the glass 32 is uneven, and thus depths of focus of respective pixels are varied. A reference depth of focus (DOF) is acquired by calculating the mean of the depths of focus of the respective pixels, and is shown in a dotted lint in FIG. 10. Reference exposure data may be generated using the reference DOF.

Figure 11:
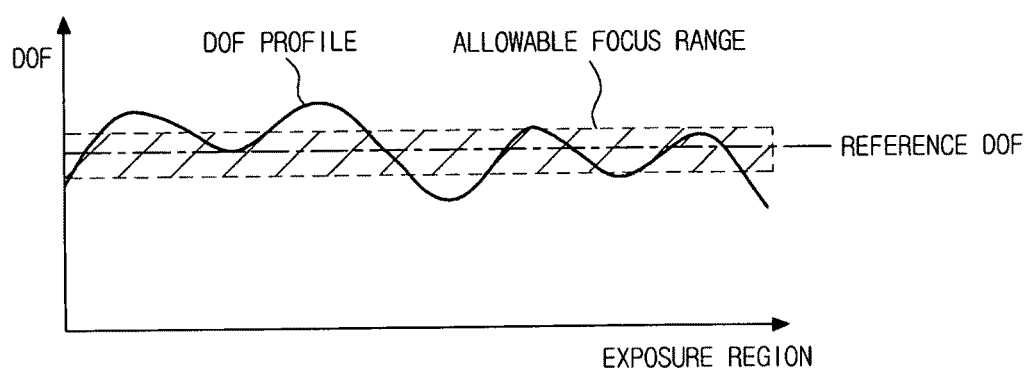
FIG. 11 is a graph illustrating a reference depth of focus (DOF) acquired with the measurement optical unit of the maskless exposure apparatus according to example embodiments and an allowable focus range.

FIG. 11 is a graph illustrating a reference depth of focus (DOF) acquired with the measurement optical unit of the maskless exposure apparatus according to example embodiments and an allowable focus range.

As shown in FIG. 10, if the uneven surface is exposed to beams, the reference DOF may be acquired based on a measured DOF profile information. Here, the allowable focus range, for example, an effective focus range is set, and beams corresponding to exposure data present within the effective focus range are switched ON and beams corresponding to other exposure data are switched OFF, thereby being capable of correcting exposure data. Hereinafter, with reference to FIGS. 12 to 20, a control method of a maskless exposure apparatus according to example embodiments will be described in detail.

Figure 12:
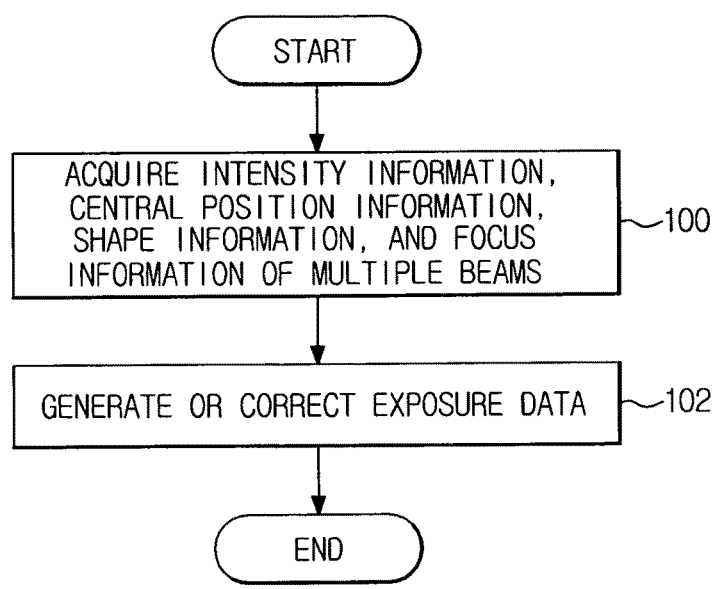
FIG. 12 is a flow chart illustrating a control method of a maskless exposure apparatus according to example embodiments.

FIG. 12 is a flow chart schematically illustrating the control method of a maskless exposure apparatus in accordance with this embodiment.

The measurement optical unit 30 acquires intensity information, central position information, shape information, and/or focus information of multiple beams, as described above, (operation 100), and generates and/or corrects exposure data using at least one information out of the acquired informations (operation 102). Hereinafter, generation and/or correction of exposure data using each of the measured informations will be individually described first, and then generation and/or correction of exposure data using all the measured informations will be described.

Figure 13:
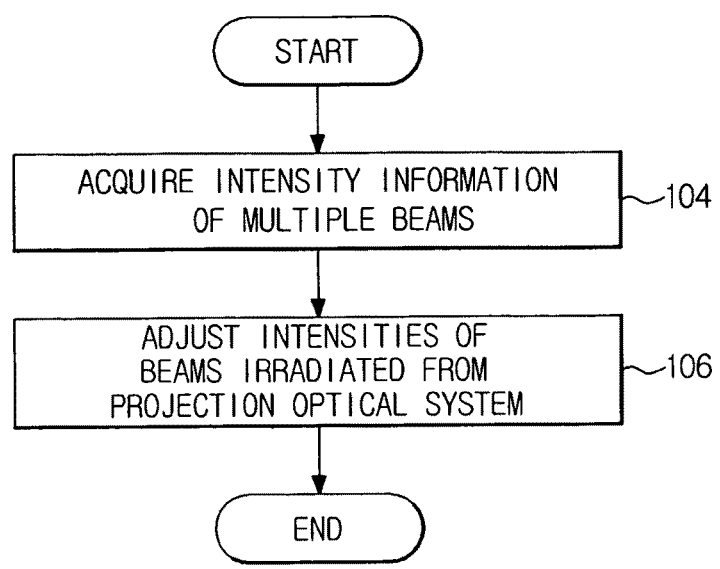
FIG. 13 is a flow chart illustrating a control method of adjusting an intensity of beams irradiated from a projection optical unit of a maskless exposure apparatus according to example embodiments.

FIG. 13 is a flow chart illustrating a control method of adjusting an intensity of beams irradiated from a projection optical unit of a maskless exposure apparatus according to example embodiments.

With reference to FIG. 13, when the projection optical unit 30 acquires intensity information of respective multiple beams (operation 104), the control unit 20 adjusts the intensities of beams irradiated from the projection optical unit based on the acquired information (operation 106). That is, if the measured intensities of the multiple beams are less than a proper intensity or are excessive, the measured intensities of the multiple beams are corrected to the proper intensity.

Figure 14:
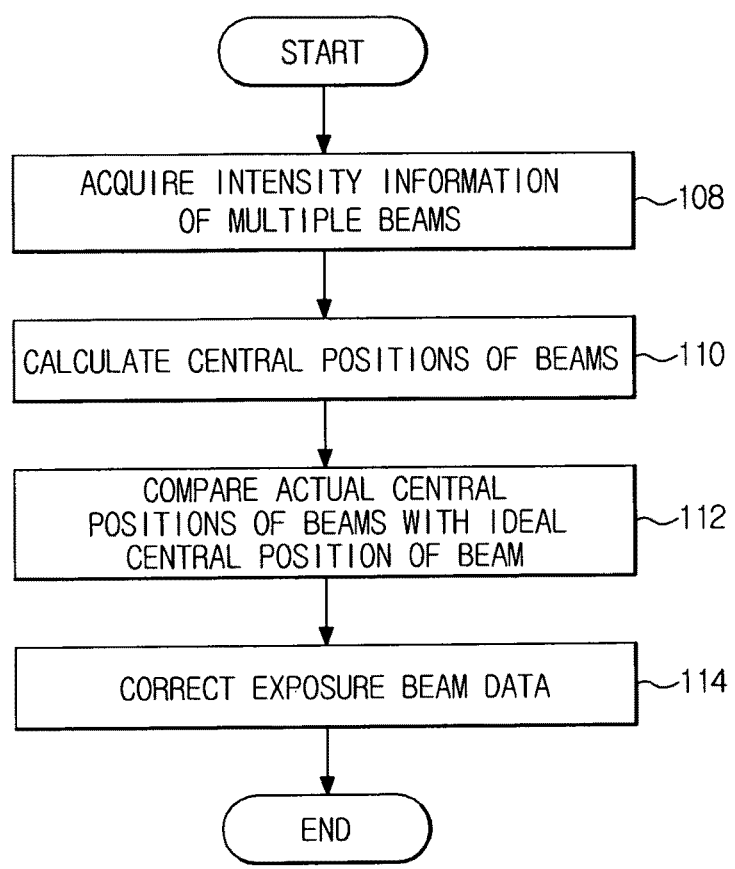
FIG. 14 is a flow chart illustrating a control method of correcting exposure beam data using central position information of beams of a maskless exposure apparatus according to example embodiments.

FIG. 14 is a flow chart illustrating a control method of correcting exposure beam data using central position information of beams of a maskless exposure apparatus according to example embodiments.

With reference to FIG. 14, when the projection optical unit 30 acquires intensity information of respective multiple beams (operation 108), the control unit 20 calculates central positions of the beams (operation 110), compares the actual central positions of the beams with an ideal central position of a beam (operation 112), and corrects exposure beam data based on errors between the actual central positions and the ideal central position (operation 114).

Figure 15:
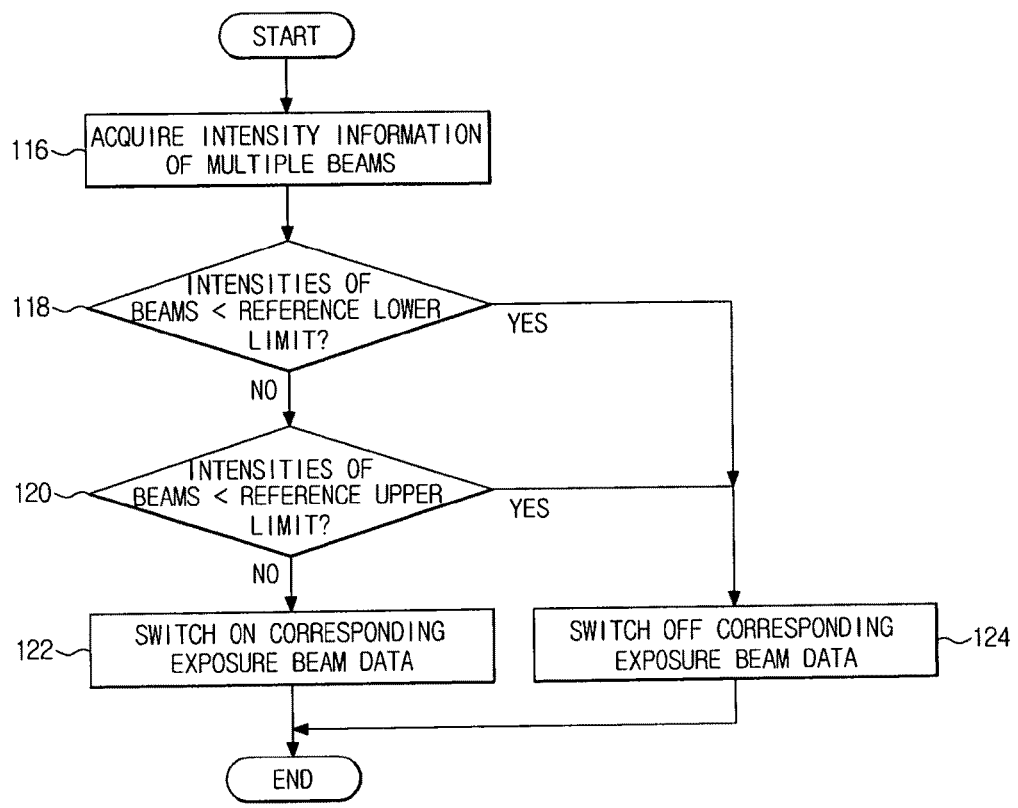
FIG. 15 is a flow chart illustrating a control method of generating or correcting exposure beam data using intensity information of beams of a maskless exposure apparatus according to example embodiments.

FIG. 15 is a flow chart illustrating a control method of generating and/or correcting exposure beam data using intensity information of beams of a maskless exposure apparatus according to example embodiments.

With reference to FIG. 15, when the projection optical unit 30 acquires intensity information of respective multiple beams (operation 116), the control unit 20 judges whether or not the intensities of the beams are lower than a reference lower limit (operation 118). If it is judged that the intensities of the beams are lower than the reference lower limit, the control unit 20 switches off corresponding exposure beam data (operation 124). If it is judged that the intensities of the beams are higher than the reference lower limit, the control unit 20 judges whether or not the intensities of the beams are lower than a reference upper limit (operation 120). If it is judges that the intensities of the beams are higher than the reference upper limit, the control unit 20 switches off the corresponding exposure beam data (operation 124). If it is judges that the intensities of the beams are lower than the reference upper limit, the control unit 20 switches on the corresponding exposure beam data (operation 122).

Figure 16:
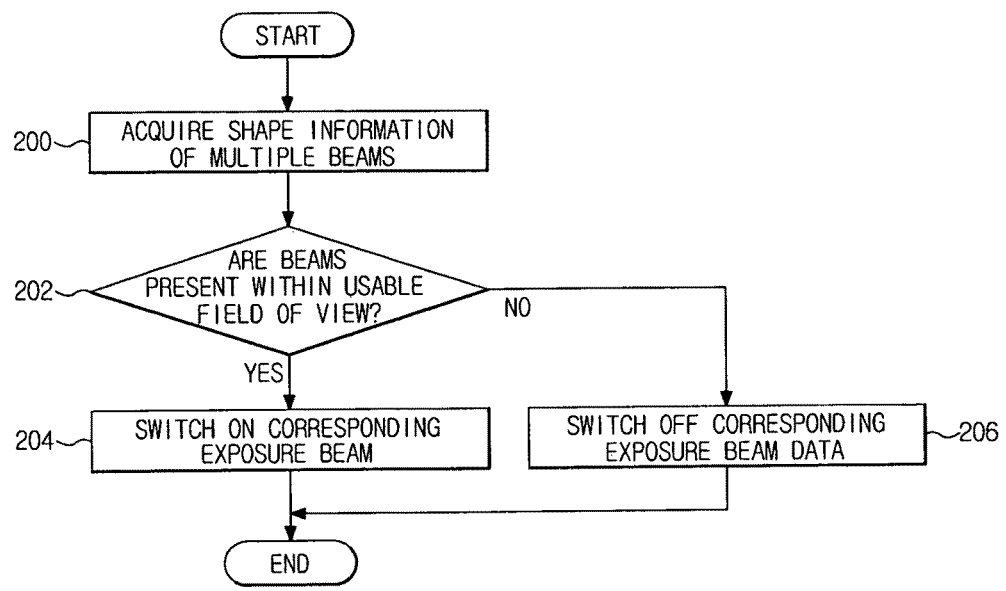
FIG. 16 is a flow chart illustrating a control method of generating or correcting exposure beam data using shape information of beams of a maskless exposure apparatus according to example embodiments.

FIG. 16 is a flow chart illustrating a control method of generating and/or correcting exposure beam data using shape information of beams of a maskless exposure apparatus according to example embodiments.

With reference to FIG. 16, the projection optical unit 30 acquires shape information of multiple beams (operation 200). The projection optical unit 30 may acquire an overall shape of the multiple beams as well as shapes of the respective multiple beams. In FIG. 16, the term 'shape' of the shape information refers to the overall shape of the multiple beams. The control unit 20 compares the overall shape of the multiple beams with a usable field of view (FOV), and judges whether or not the multiple beams are present within the usable FOV (operation 202). Here, if it is judged that the multiple beams are present outside the usable FOV, the control unit 20 switches off corresponding exposure beam data (operation 206), and if it is judged that the multiple beams are present within the usable FOV, the control unit 20 switches on the corresponding exposure beam data (operation 204).

Figure 17:
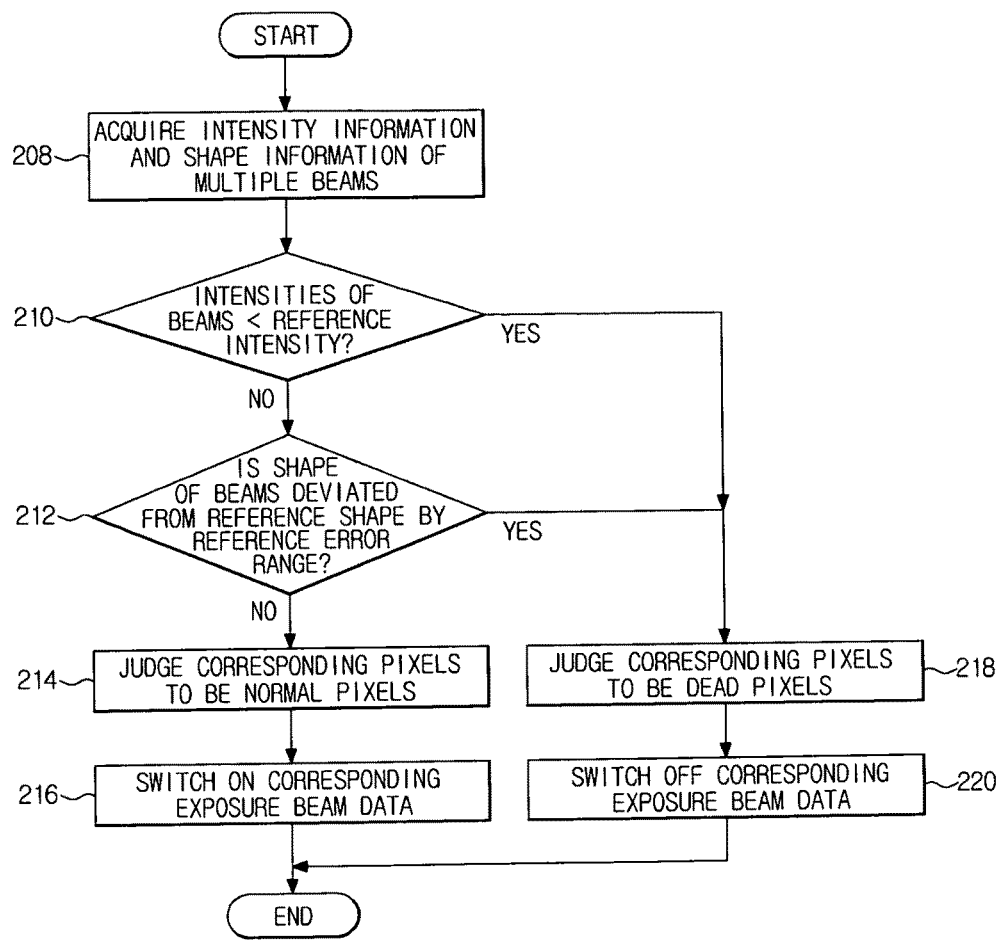
FIG. 17 is a flow chart illustrating a control method of judging dead pixels using intensity information and shape information of beams of a maskless exposure apparatus according to example embodiments, and generating or correcting exposure data using the dead pixel information.

FIG. 17 is a flow chart illustrating a control method of judging dead pixels using intensity information and shape information of beams of a maskless exposure apparatus according to example embodiments, and generating and/or correcting exposure data using the dead pixel information.

With reference to FIG. 17, when the projection optical unit 30 acquires intensity information and shape information of multiple beams (operation 208), the control unit 20 judges that the intensities of the beams are lower than a reference intensity (operation 210). If it is judged that the intensities of the beams are lower than the reference intensity, the control unit 20 judges corresponding pixels to be dead pixels (operation 218), and switches off corresponding exposure beam data (operation 220). If it is judged that the intensities of the beams are higher than the reference intensity, the control unit 20 judges whether or not the shape of the beams is deviated from a reference shape by a reference error range (operation 212). If it is judge that the shape of the beams is deviated from the reference shape by the reference error range, the control unit 20 judges the corresponding pixels to be dead pixels (operation 218), and switches off the corresponding exposure beam data (operation 220). If it is judge that the shape of the beams is not deviated from the reference shape by the reference error range, the control unit 20 judges the corresponding pixels to be normal pixels (operation 214), and switches on the corresponding exposure beam data (operation 216).

Figure 18:
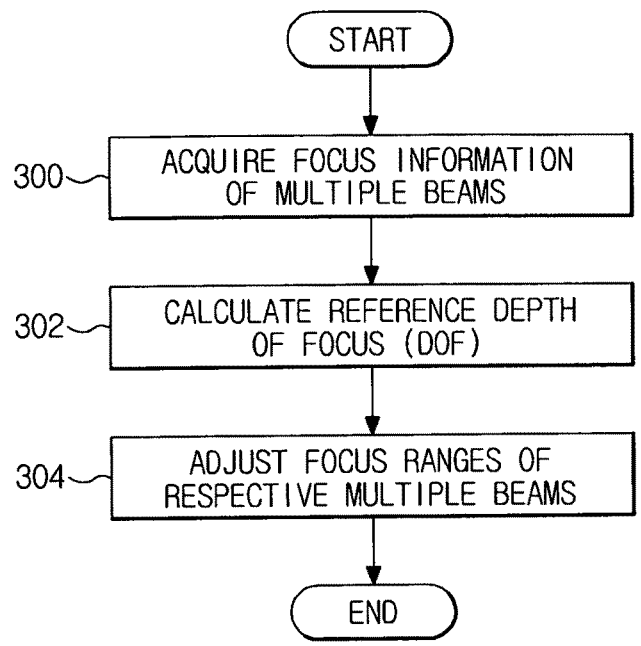
FIG. 18 is a flow chart illustrating a control method of adjusting focus ranges of respective multiple beams using focus information of beams of a maskless exposure apparatus according to example embodiments.

FIG. 18 is a flow chart illustrating a control method of adjusting focus ranges of respective multiple beams using focus information of beams of a maskless exposure apparatus according to example embodiments.

With reference to FIG. 18, when the projection optical unit 30 acquires focus information of multiple beams (operation 300), the control unit 20 calculates a reference depth of focus (DOF) from the focus information (operation 302), and adjusts focus ranges of the respective multiple beams based on the reference DOF (operation 304).

Figure 19:
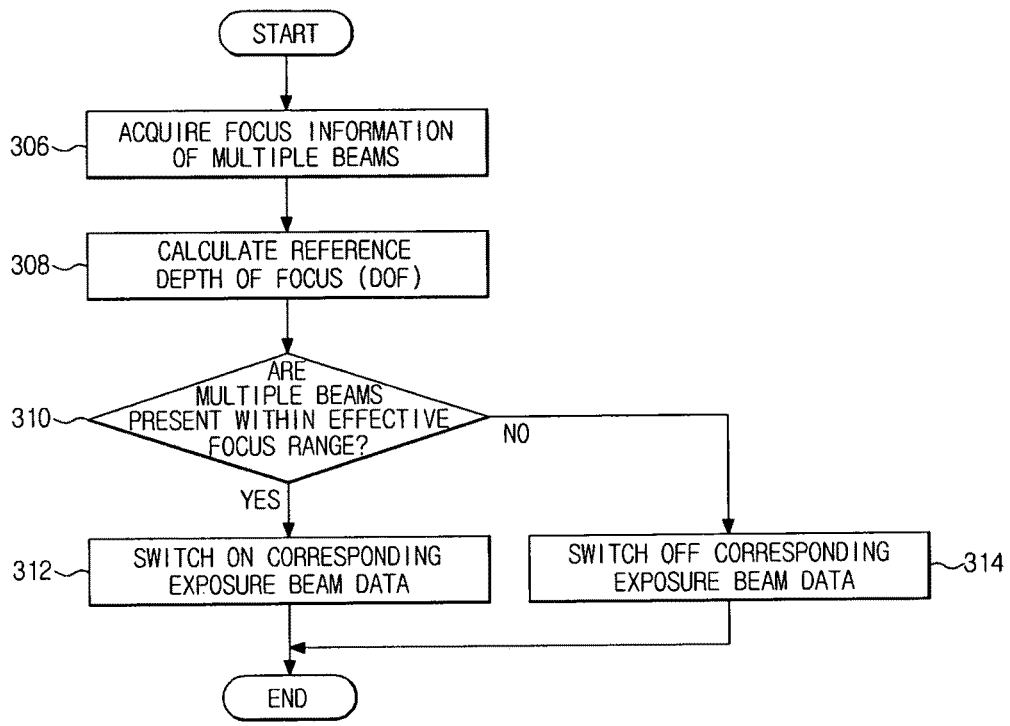
FIG. 19 is a flow chart illustrating a control method of generating or correcting exposure data using focus information of beams of a maskless exposure apparatus according to example embodiments.

FIG. 19 is a flow chart illustrating a control method of generating and/or correcting exposure data using focus information of beams of a maskless exposure apparatus according to example embodiments.

With reference to FIG. 19, the projection optical unit 30 acquires focus information of multiple beams (operation 306). Thereafter, the control unit 20 calculates a reference depth of focus (DOF) from the focus information (operation 308), and judges whether or not the multiple beams are present within an effective focus range (operation 310). If it is judged that the multiple beams are not present within the effective focus range, the control unit 20 switches off corresponding exposure beam data (operation 314). If it is judged that the multiple beams are present within the effective focus range, the control unit 20 switches on corresponding exposure beam data (operation 312).

Figure 20:
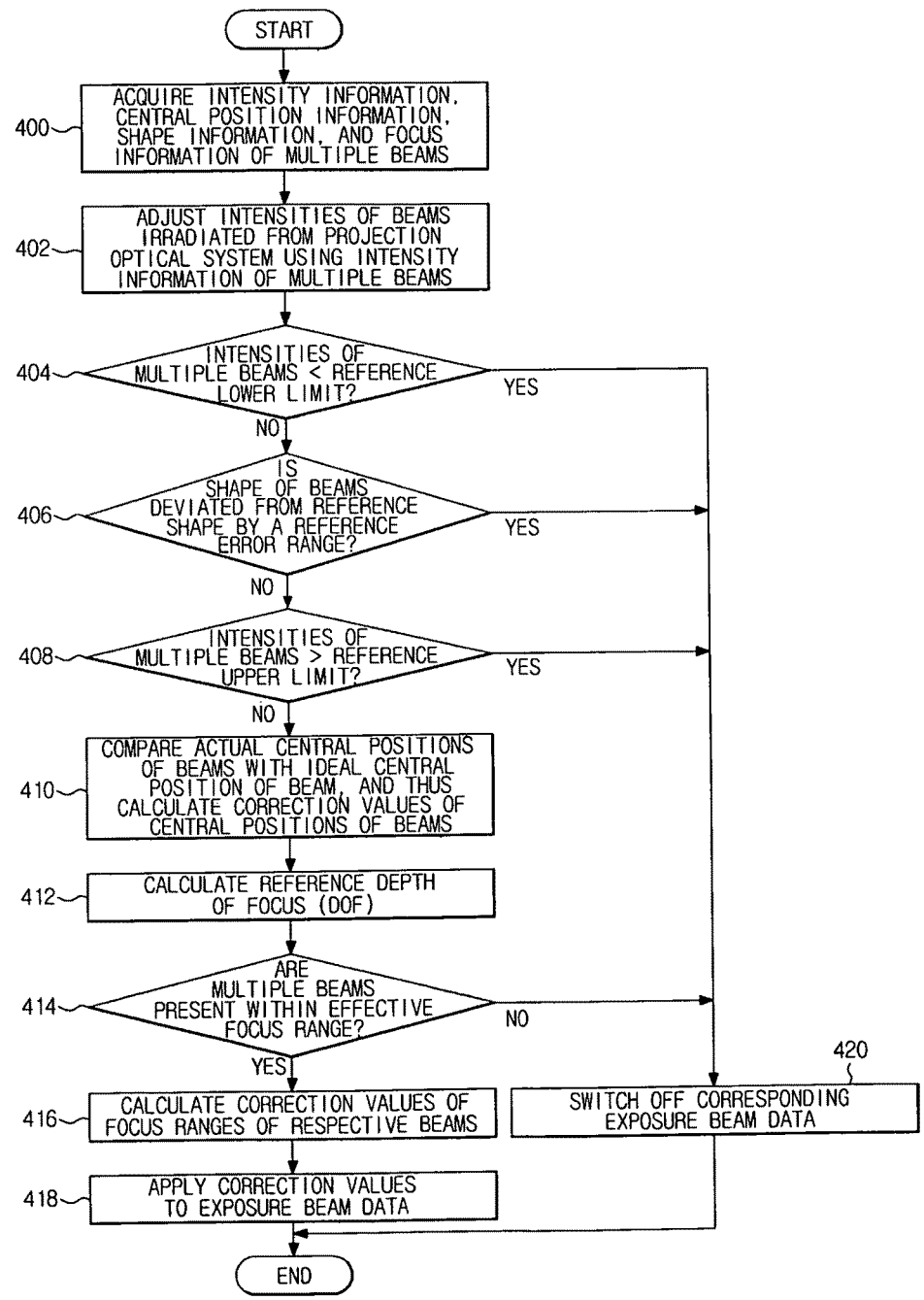
FIG. 20 is a flow chart illustrating a control method of generating or correcting exposure data using intensity information, central position information, shape information, and focus information of beams of a maskless exposure apparatus according to example embodiments.

FIG. 20 is a flow chart illustrating a control method of generating and/or correcting exposure data using intensity information, central position information, shape information, and/or focus information of beams of a maskless exposure apparatus according to example embodiments.

With reference to FIG. 20, the measurement optical unit 30 acquires intensity information, central position information, shape information, and/or focus information of multiple beams (operation 400). Then, the control unit 20 adjusts intensities of beams irradiated from the projection optical unit 15 using the intensity information of the multiple beams among the measured informations (operation 402).

Thereafter, the control unit 20 judges whether or not the intensities of the multiple beams are less than a reference lower limit (operation 404), and, if it is judged that the intensities of the multiple beams are less than the reference lower limit, the control unit 20 judges corresponding pixels to be dead pixels, and switches off corresponding exposure beam data (operation 420). If it is judged that the intensities of the multiple beams are not less than the reference lower limit, the control unit 20 judges whether or not the shape of the beams is deviated from a reference shape by a reference error range (operation 406). If it is judge that the shape of the beams is deviated from the reference shape by the reference error range, the control unit 20 judges the corresponding pixels to be dead pixels, and switches off the corresponding exposure beam data (operation 420).

If it is judge that the shape of the beams is not deviated from the reference shape by the reference error range, the control unit 20 judges whether or not the intensities of the beams are higher than a reference upper limit (operation 408). If it is judges that the intensities of the beams are higher than the reference upper limit, the control unit 20 switches off the corresponding exposure beam data (operation 420). If it is judges that the intensities of the beams are not higher than the reference upper limit, the control unit 20 compares the actual central position of the beams with an ideal central position of a beam, and thus calculates correction values of the central positions of the beams (operation 410). Thereafter, the control unit 20 calculates a reference depth of focus (DOF) (operation 412), and judges whether or not the beams are present within an effective focus range (operation 414). If it is judged that the beams are not present within the effective focus range, the control unit 20 switches off the corresponding exposure beam data (operation 420). If it is judged that the multiple beams are present within the effective focus range, the control unit 20 calculates correction values of focus ranges of the respective beams (operation 416).

The control unit 20 controls the maskless exposure apparatus 10 using the above-calculated correction values of exposure beam data.

The above maskless exposure apparatus 10 is provided with the measurement optical unit 30 which acquires intensity information, central position information, shape information, and/or focus information of multiple beams to be measured, thereby more accurately and rapidly performing exposure.

As may be understood from the above description, a maskless exposure apparatus according to example embodiments includes a measurement optical unit including a photo sensor and an image sensor, thereby rapidly acquiring intensity information, central position information, shape information, and/or focus information of multiple beams.

Further, the maskless exposure apparatus more accurately generates and/or corrects exposure data using at least one information of the acquired informations.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A control method of a maskless exposure apparatus comprising:
    acquiring, using a measurement optical unit, intensity information, central position information, depths of focus information, and shape information of a plurality of beams, generated from a projection optical unit without reference patterns; and
    generating or correcting exposure data using the depths of focus information of the multiple beams acquired by the measurement optical unit, wherein the generating or correcting exposure data includes: calculating a reference depth of focus by calculating a mean of the depths of focus information of the plurality of beams; and correcting exposure data by switching ON beams corresponding to pixels being present within an effective focus range and switching OFF beams corresponding to the remaining pixels.

2. The control method according to claim 1, wherein the generating or correcting exposure data further includes:
    adjusting intensities of the beams irradiated from the projection optical unit using the intensity information of the plurality of beams acquired by the measurement optical unit.

3. The control method according to claim 1, wherein the generating or correcting exposure data further includes:
    calculating central positions of the plurality of beams using the intensity information of the plurality of beams acquired by the measurement optical unit; and
    correcting the exposure data by comparing the calculated central positions of the plurality of beams with an ideal central position of a beam.

4. The control method according to claim 1, wherein the generating or correcting exposure data further includes:
    switching off at least one beam of the plurality of beams, the at least one beam having an intensity less than a reference lower limit or greater than a reference upper limit, the intensity information being acquired by the measurement optical unit.

5. The control method according to claim 1, wherein the generating or correcting exposure data further includes:
    switching ON beams included within a field of view (FOV) and switching OFF the remaining beams.

6. The control method according to claim 1, wherein the generating or correcting exposure data further includes:
    judging corresponding pixels as dead pixels when an illumination amount of the plurality of beams acquired by the measurement optical unit is less than a reference amount or a shape of the beams is deviated from an ideal shape by a reference error; and
    switching off beams corresponding to the dead pixels, or switching off beams corresponding to pixels of a line including the dead pixels not affecting exposure results.

7. The control method according to claim 1, wherein the generating or correcting exposure data further includes:
    adjusting focus ranges of respective beam spots using the reference depth of focus.

8. A maskless exposure apparatus comprising:
    a projection optical unit configured to generate a plurality of beams;
    a reference pattern-free measurement optical unit configured to acquire intensity information, central position information, focus information, and shape information of the plurality of beams by measuring the plurality of beams generated from the projection optical unit; and
    a controller unit to generate or correct exposure data using at least one information of the intensity information, the central position information, and focus information, and the shape information, acquired by the measurement optical unit,
    wherein the controller unit is configured to acquire the depths of focus of the plurality of beams acquired by the measurement optical unit, to calculate a reference depth of focus by calculating a mean of the depths of focus information of the plurality of beams, to set an effective focus range based on the reference depth of focus, and to correct exposure data by switching on beams corresponding to exposure data present within the effective focus range and switching off beams corresponding to exposure data outside the effective focus range.

9. The maskless exposure apparatus according to claim 8, further comprising:
    a movable stage and guide on a table;
    a frame connected to a central portion of the stage; and
    at least two sensors on a side of the frame,
    wherein the projection optical unit is on a side of the frame opposite to the at least two sensors.

10. The maskless exposure apparatus according to claim 9, wherein the projection optical unit includes an exposure head unit including a light source and a multi-exposure head unit, the multi-exposure head unit configured to generate the plurality of beams.

11. The maskless exposure apparatus according to claim 8, wherein the measurement optical unit includes a photo sensor.

12. The maskless exposure apparatus according to claim 8, wherein the measurement optical unit includes an image sensor.

13. The maskless exposure apparatus according to claim 12, wherein the image sensor is a CMOS sensor or a CCD sensor.

14. The maskless exposure apparatus according to claim 8, further comprising position adjusting stages that is configured to move the measurement optical unit in at least three dimensions.

15. The maskless exposure apparatus according to claim 8, wherein the controller unit is configured to acquire central positions of the plurality of beams by calculating a mean of the intensity information of the plurality of beams acquired by the measurement optical unit based on a full width at half maximum (FWHM), compare the calculated central positions of the plurality of beams with an ideal central position of a beam, and correct the exposure data by adjusting intensities of the plurality of beams irradiated from the projection optical unit using the comparison data.

16. The maskless exposure apparatus according to claim 9, wherein the controller unit is configured to switch off at least one beam of the plurality of beams, the at least one beam having an intensity less than a reference lower limit or greater than a reference upper limit, the intensity information being acquired by the measurement optical unit.

17. The maskless exposure apparatus according to claim 8, wherein the controller unit is configured to switch ON beams included within a field of view (FOV) and switching OFF the remaining beams.

* * * * *